(12) United States Patent
Komiyatani et al.

(10) Patent No.: US 6,447,915 B1
(45) Date of Patent: Sep. 10, 2002

(54) INTERLAMINAR INSULATING ADHESIVE FOR MULTILAYER PRINTED CIRCUIT BOARD

(75) Inventors: Toshio Komiyatani; Masao Uesaka; Masataka Arai; Hitoshi Kawaguchi, all of Tokyo (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 0 days.

(21) Appl. No.: 09/518,250

(22) Filed: Mar. 3, 2000

(30) Foreign Application Priority Data

Mar. 11, 1999 (JP) .............................................. 11-64251

(51) Int. Cl.$^7$ .............................................. B32B 15/08
(52) U.S. Cl. ........................ 428/416; 523/455; 525/423; 525/523; 525/528; 525/936; 156/330; 156/331.1; 428/418; 428/419
(58) Field of Search ................................ 428/344, 416, 428/418, 419; 523/455; 525/423, 523, 528, 936; 156/330

(56) References Cited

U.S. PATENT DOCUMENTS

| | | | | |
|---|---|---|---|---|
| 4,661,559 A | * | 4/1987 | Gardner et al. | 525/65 |
| 4,663,401 A | | 5/1987 | Saito et al. | |
| 5,434,226 A | | 7/1995 | Nguyen et al. | |
| 5,544,773 A | | 8/1996 | Haruta et al. | |
| 5,589,523 A | * | 12/1996 | Sawaoka et al. | 52/211 |

FOREIGN PATENT DOCUMENTS

| | | | |
|---|---|---|---|
| EP | 0 496 698 A2 | | 7/1992 |
| EP | 0 498 766 A2 | | 8/1992 |
| EP | 42 17 509 A1 | | 12/1993 |
| JP | 11 035916 | | 2/1999 |
| JP | 2001-181375 | * | 3/2001 |

OTHER PUBLICATIONS

European Search Report for counterpart application No. EP 00104843, dated Oct. 25, 2001.

* cited by examiner

Primary Examiner—Robert Dawson
Assistant Examiner—Christopher M. Keehan
(74) Attorney, Agent, or Firm—Smith, Gambrell & Russell, LLP

(57) ABSTRACT

In order to provide a multilayer printed circuit board having a fine pitch circuit, the interlaminar insulating adhesive used therein must have heat resistance and low thermal expansion coefficient so that required accuracy can be obtained during circuit formation and mounting of components. Therefore, the present invention aims at providing a multilayer printed circuit board which uses an interlaminar insulating adhesive superior in heat resistance and low in thermal expansion coefficient and wherein the insulating adhesive layer has a small variation in thickness between circuit layers. That is, the present invention lies in an interlaminar insulating adhesive for multilayer printed circuit board containing the following components as essential components:

(a) a sulfur-containing thermoplastic resin having a weight-average molecular weight of $10^3$ to $10^5$,
(b) a sulfur-containing epoxy or phenoxy resin having a weight-average molecular weight of $10^3$ to $10^5$,
(c) a multifunctional epoxy resin having an epoxy equivalent of 500 or less, and
(d) an epoxy-curing agent.

12 Claims, No Drawings

INTERLAMINAR INSULATING ADHESIVE FOR MULTILAYER PRINTED CIRCUIT BOARD

The present invention relates to an interlaminar insulating resin adhesive for multilayer printed circuit board. More particularly, the present invention relates to an interlaminar insulating adhesive of epoxy resin type for multilayer printed circuit board, which has flame retardancy without containing halogen or phosphorus, which has excellent thermal property, which can give an interlaminar insulating layer of uniform thickness, and which is suitable for formation of fine pattern; as well as to a copper foil coated with said interlaminar insulating adhesive.

Production of a multilayer printed circuit board has been conducted by a process comprising steps of laminating, on an inner layer circuit substrate having a circuit, at least one prepreg obtained by impregnating a glass cloth with an epoxy resin, followed by semi-curing, laminating a copper foil thereon, and molding the resulting material into one piece by hot plate pressing. In this conventional process, the steps of laminating a prepreg(s) and a copper foil(s) on an inner layer circuit substrate, the cost of prepreg(s), etc. incur a high cost; further, obtainment of an interlaminar insulating resin layer of uniform thickness between circuit layers is difficult because, during molding, the resin is allowed to flow by heat and pressure so as to fill the concave portions of the inner-layer circuit substrate and eliminate voids; furthermore, when a glass cloth is present between circuit layers and the impregnatability of resin into the glass cloth is low, there may appear undesirable phenomena such as moisture absorption, copper migration and the like.

In order to solve these problems, attention has been paid in recent years, again to a technique of producing a multilayer printed circuit board using a conventional press but without using any glass cloth in the insulating layer between circuit layers. In using a press but using no glass cloth or the like as a base material of insulating layer, it has been difficult to obtain an interlaminar insulating layer low in thickness variation between circuit layers.

Recently, heat resistance has also become necessary, because bare chips have come to be mounted even on the substrate of a portable telephone or the mother board of a personal computer and the chips mounted thereon have become to possess a higher function, and hence the number of terminals has increased and accordingly circuits have come to have a finer pitch. In addition, use of an environment-friendly material containing no halogen compound or the like has become necessary.

When a film-shaped interlaminar insulating resin layer is used in a multilayer printed circuit board of build-up type, the thickness variation of the interlaminar insulating resin layer after press molding tends to be large because the insulating resin layer contains no glass cloth as a base material; therefore, in such a case, it is necessary to employ strictly controlled molding conditions, making difficult the molding.

In such a process, when a resin of high softening point is coated on the roughened surface of a copper foil in one layer, the resin shows low flowability during molding and does not satisfactorily flow so as to fill the concave portions of inner-layer circuit. When a resin of low softening point and accordingly high flowability is coated in one layer, the flow amount of the resin is too large and it is difficult to secure an insulating resin layer of uniform thickness, although the concave portions of inner-layer circuit can be filled. This problem can be solved by coating an interlaminar insulating adhesive in two layers consisting of a high-flowability layer and a low-flowability layer.

In order to achieve a fine-pitch circuit, the interlaminar insulating adhesive is required to further have heat resistance and low thermal expansion coefficient so that the accuracy during circuit formation and component mounting can be maintained. Many of interlaminar insulating adhesives of conventional type have a glass transition temperature of about 120° C. and therefore give rise to delamination of insulating layer.

Thermosetting resins typified by epoxy resin, etc. are widely used, for their excellent properties, in printed circuit boards and other electric or electronic appliances. They are, in many cases, allowed to have flame retardancy so that they are resistant to fire. Flame retardancy of these resins has generally been achieved by using a halogen-containing compound (e.g. brominated epoxy resin). These halogen-containing compounds have high flame retardancy, but have various problems. For example, brominated aromatic compounds release corrosive bromine or hydrogen bromide when heat-decomposed and, when decomposed in the presence of oxygen, may generate very toxic so-called dioxins such as polybromodibenzofuran and polydibromobenzoxin; further, disposal of bromine-containing waste materials is difficult. For these reasons, phosphorus compounds and nitrogen compounds have recently been studied as a flame retardant replacing bromine-containing flame retardants. For phosphorus compounds, however, there is a fear that when their wastes are used for land reclamation, they may dissolve in water and pollute rivers or soils. When a phosphorus component is taken into the skeleton of resin, a hard but fragile cured material is obtained, and therefore such a cured material often has problems in strength, impact resistance (when dropped), etc. when made into a thin layer of several tens of $\mu$m in thickness as used in the present invention. Further, resin compositions containing a phosphorus compound show high water absorption, which is disadvantageous from the standpoint of reliable insulation.

A study was made on a material which has excellent flame retardancy without containing any of halogen, antimony and phosphorus and which dose not cause the above-mentioned various problems. As a result, the present invention has been completed. The present invention provides a multilayer printed circuit board having a glass cloth-free insulating layer, which has excellent thermal property and which is low in thickness variation of the interlaminar insulating resin layer.

The present invention lies in an interlaminar insulating adhesive for multilayer printed circuit board containing the following components as essential components:

(a) a sulfur-containing thermoplastic resin having a weight-average molecular weight of $10^3$ to $10^5$, (b) a sulfur-containing epoxy or phenoxy resin having a weight-average molecular weight of $10^3$ to $10^5$, (c) a multifunctional epoxy resin having an epoxy equivalent of 500 or less, and (d) an epoxy-curing agent.

In the present invention, the component (a), i.e. the sulfur-containing thermoplastic resin having a weight-average molecular weight of $10^3$ to $10^5$ is used so that (1) the resin flowability during press molding becomes low and the insulating layer formed can maintain an intended thickness, (2) the adhesive composition can have flexibility, and (3) the insulating resin layer can have improved heat resistance and reduced heat history. When the weight-average molecular weight is smaller than $10^3$, the flowability during molding is too high and the insulating layer formed is unable to maintain an intended thickness. When the weight-average molecular weight is larger than $10^5$, the component (a) has low compatibility with the epoxy resins and shows inferior flowability. The weight-average molecular weight of the component (a) is preferably $5 \times 10^3$ to $10^5$ from the standpoint of the flowability. The sulfur-containing thermoplastic resin as component (a) is preferably amorphous because no crystal is formed when subjected to heat history of heating and cooling.

The component (a) includes polysulfone and polyethersulfone. The sulfur-containing thermoplastic resin, when modified with a hydroxyl group, a carboxyl group or an amino group at the terminal(s), has high reactivity with the epoxy resins; as a result, the phase separation between the sulfur-containing thermoplastic resin and the epoxy resins after heat-curing can be suppressed, and the cured material has increased heat resistance. Thus, a sulfur-containing thermoplastic resin modified as above is preferred.

The proportion of the high-molecular, sulfur-containing thermoplastic resin (a) is preferably 20 to 70% by weight based on the total resin. When the proportion is smaller than 20% by weight, the adhesive composition has no sufficiently high viscosity and is unable to reliably give an intended layer thickness; therefore, the insulating layer after pressing is unable to have a desired thickness, the outer-layer circuit is inferior in flatness, and heat resistance is insufficient. Meanwhile, when the proportion of the sulfur-containing thermoplastic resin (a) is larger than 70% by weight, the adhesive composition is hard and lacks in elasticity; therefore, is inferior in adaptability and adhesion to the uneven surface of an inner layer circuit substrate during press molding, generating voids.

With the component (a) alone, no flowability is expected which enables molding under ordinary pressing conditions (200° C. or below). Therefore, the component (b), i.e. the sulfur-containing epoxy or phenoxy resin having a weight-average molecular weight of $10^3$ to $10^5$ is added for adjustment of flowability, better handling, higher tenacity of cured material, etc. As the sulfur-containing epoxy or phenoxy resin, there are ordinarily used bisphenol S type epoxy or phenoxy resin, and epoxy or phenoxy resin having both a bisphenol S skeleton and a bisphenol or biphenyl skeleton. An epoxy or phenoxy resin having both a bisphenol S skeleton and a biphenyl skeleton is preferred because it has good compatibility with the component (a), and it preferably has a weight-average molecular weight of $10^4$ to $10^5$ from the standpoint of flowability. Owing to the presence of sulfur in the component (b), the component (b) can have good compatibility with the component (a), the resulting adhesive varnish can have stability, and the cured material can have uniformity and good thermal property. The proportion of the component (b) used is ordinarily 10 to 40% by weight based on the total resin. When the proportion is smaller than 10% by weight, the flowability during press molding is not sufficient, the adhesion of the resulting adhesive is low; and voids are generated easily. Meanwhile, a proportion larger than 40% by weight tends to give insufficient heat resistance.

Only with the components (a) and (b) which are high-molecular, sulfur-containing resins, adhesion is low; heat resistance during the soldering for component mounting is insufficient; and the varnish of components (a) and (b) dissolved in a solvent has a high viscosity and, in coating on a copper foil, is inferior in wettability and workability. In order to improve these drawbacks, the component (c), i.e. the multifunctional epoxy resin having an epoxy equivalent of 500 or less is added. For lower viscosity, the polyfunctional epoxy resin preferably has a weight-average molecular weight of 1,000 or less. The proportion of this component is 10 to 70% by weight based on the total resin. When the proportion is smaller than 10% by weight, the above effect is not obtained sufficiently. When the proportion is larger than 70% by weight, the effect of the high-molecular, sulfur-containing thermoplastic resin is small.

The epoxy resin as component (c) includes bisphenol type epoxy resin, novolac type epoxy resin, biphenyl type epoxy resin, dicyclopentadiene type epoxy resin, alcohol type epoxy resin, alicyclic type epoxy resin, aminophenol type epoxy resin, etc.; when flame retardancy is needed, includes naphthalene type epoxy resin, biphenyl type epoxy resin, bisphenol S type epoxy resin, indene-modified phenolic novolac type epoxy resin, indene-modified cresol novolac type epoxy resin, phenyl ether type epoxy resin, phenyl sulfide type epoxy resin, etc., which are all superior in flame retardancy. These epoxy resins are high in proportion of aromatic ring and are superior in flame retardancy and heat resistance.

The component (d), i.e. the epoxy-curing agent includes amine compounds, imidazole compounds, acid anhydrides, etc. and there is no particular restriction as to the kind. However, an amine type curing agent having sulfone group is preferred. The presence of sulfone group in the curing agent (d) enhances the compatibility between the thermoplastic resin (a) having sulfone group and the components (b) and (c), gives a uniform cured material, and enables formation of a stable insulating resin layer. Further, owing to the enhanced compatibility, better dielectric property, particularly smaller dielectric loss is possible, and higher storage stability, that is, storage stability of 3 months or longer at 20° C. can be obtained. The proportion of the curing agent is preferably 0.9 to 1.1 in terms of equivalent ratio to the total of the component (b) and the component (c). When the proportion deviates from this range, heat resistance and electrical property decrease.

Imidazole compounds can cure an epoxy resin sufficiently even when used in a small amount. When there is used an epoxy resin to which flame retardancy is imparted by bromination or the like, the imidazole compounds can allow the epoxy resin to effectively exhibit the flame retardancy. A particularly preferred imidazole compound is one which has a melting point of 130° C. or higher, is a solid at ordinary temperature, has low solubility in an epoxy resin, and quickly reacts with the epoxy resin at high temperatures of 150° C. or more. Specific examples of such an imidazole compound are 2-methylimidazole, 2-phenylimidazole, 2-phenyl-4-mehtylimidazole, bis(2-ethyl-4-methylimidazole), 2-phenyl-4-methyl-5-hydrxymethylimidazole, 2-phenyl-4,5-dihydroxymethylimidazole and triazine-added imidazoles. These imidazoles are uniformly dispersible in an epoxy resin varnish, in the form of a fine powder. Such an imidazole has low compatibility with an epoxy resin; therefore, no reaction takes place at ordinary temperature to 100° C. and good storage stability can be obtained. When heated to 150° C. or higher during molding under heat and pressure, the imidazole reacts with the epoxy resin, producing a uniform cured material.

As other curing agents, there can be mentioned acid anhydrides such as phthalic anhydride, tetrahydrophthalic anhydride, methyltetrahydrophthalic anhydride, methylendomethylenetetrahydrophthalic anhydride, methylbutenyltetrahydrophthalic anhydride, hexahydrophthalic anhydride, methylhexahydrophthalic anhydride, trimellitic anhydride, pyromellitic anhydride, benzophenonetetracarboxylic anhydride and the like; amine complexes of boron trifluoride; dicyandiamide or derivatives thereof; and so forth. Epoxy adducts or microencapsulated products of the above compounds can also be used.

It is possible to further use a component reactive with the epoxy resin or the curing agent. Examples of such a component are epoxy reactive diluents (e.g. monofunctional: phenyl glycidyl ether, bifunctional: resorcin diglycidyl ether and ethylene glycol glycidyl ether, trifunctional: glycerol triglycidyl ether), resole type or novolac type phenolic resins, and isocyanate compounds.

For improvement in linear expansion coefficient, heat resistance, flame retardancy, etc., it is preferred to use, in addition to the above-mentioned components, inorganic fillers such as fused silica, crystalline silica, calcium carbonate, aluminum hydroxide, alumina, clay, barium sulfate, mica, talc, white carbon, E glass fine powder and the like. The proportion of the filler used is ordinarily 40% by weight or smaller based on the resin content. When the proportion is larger than 40% by weight, the viscosity of the interlaminar insulating resin is high and the flowability of the resin into the inner-layer circuit is low.

It is also possible to use a silane coupling agent (e.g. epoxy silane) or a titanate type coupling agent for higher adhesion to copper foil or inner-layer circuit substrate or for higher moisture resistance; an anti-foaming agent for prevention of void generation; or a flame retardant of liquid or fine powder type.

As to the solvent used in the present adhesive, it is necessary to select a solvent which does not remain in the adhesive after the adhesive has been coated on a copper foil and dried at 80 to 130° C. There can be used, for example, acetone, methyl ethyl ketone (MEK), toluene, xylene, n-hexane, methanol, ethanol, methyl cellosolve, ethyl cellosolve, methoxypropanol, cyclohexanone, and dimethylformamide (DMF).

The copper foil coated with an interlaminar insulating adhesive is produced by coating an adhesive varnish which is obtained by dissolving individual adhesive components in a particular solvent at given concentrations, on the anchorage side of a copper foil, followed by drying at 80 to 130° C. so that the concentration of volatile component in the adhesive becomes 4.0% or less, preferably 3.0 to 1.5%. The thickness of the adhesive is preferably 100 μm or less. When the thickness exceeds 100 μm, variation in thickness appears and no uniform insulating layer is secured.

When in the copper foil coated with an interlaminar insulating adhesive, the adhesive layer is formed in two layers of different flowability and the adhesive layer adjacent to the copper foil has lower flowability than the outer adhesive layer, excellent moldability is obtained and there can be produced a multilayer printed circuit board which has no void and which is low in variation in thickness of the interlaminar insulating layer.

The copper foil coated with an interlaminar insulating adhesive is laminated on an inner-layer circuit substrate by using an ordinary vacuum press or laminator, followed by curing, whereby a multilayer printed circuit board having an outer-layer circuit can be produced easily.

The present invention is explained below by way of Examples. In the following, "part" refers to "part by weight".

EXAMPLE 1

In a mixed solvent of MEK and DMF were dissolved, with stirring, 40 parts of a hydroxyl-terminated amorphous polyethersulfone (weight-average molecular weight: 24,000), 30 parts of an epoxy resin having a bisphenol S skeleton and a biphenyl skeleton (weight-average molecular weight: 34,000, bisphenol S/biphenyl molar ratio: 5/4), 25 parts of a biphenyl type epoxy resin (weight-average molecular weight: 800, epoxy equivalent: 275), 25 parts of a novolac type epoxy resin (weight-average molecular weight: 320, epoxy equivalent: 175), 9.5 parts of diaminodiphenylsulfone and 0.5 part of 2-methylimidazole as a curing accelerator, whereby a varnish was prepared. Thereto were added 0.2 part of a titanate type coupling agent and 20 parts of barium sulfate based on 100 parts of the resin solid in the varnish. The mixture was stirred until a uniform dispersion was obtained, whereby an adhesive varnish was produced.

The adhesive varnish was coated on the anchorage surface of a copper foil of 18 μm in thickness by using a comma coater, followed by drying at 170° C. for 5 minutes, to obtain a copper foil coated with an insulating adhesive in a thickness of 40 μm. On the adhesive layer was coated the same adhesive varnishby using a comma coater, followed by drying at 150° C. for 5 minutes, to newly form an insulating adhesive layer of 40 μm in thickness.

Next, a laminated sheet consisting of a glass-epoxy base material of 0.1 mm in thickness and two copper foils each of 35 μm in thickness laminated on the both sides of the base material was subjected to patterning to obtain an inner layer circuit sheet [fine circuit of line width (L)/line interval (S)=120 μm/180 μm, clearance holes (1 mm and 3 mm in diameter), there was, at the peripheral portion, a copper foil line of 3 mm in width interposed between two slits each of 2 mm in width]. The surface of each copper foil of the inner-layer circuit sheet was subjected to a blackening treatment. Then, on each blackened surface was placed the above-prepared copper foil coated with an adhesive in two layers, so that the adhesive side of the copper foil contacted with the blackened surface, whereby was prepared a laminate consisting of an inner-layer circuit sheet and two copper foils each having two adhesive layers, placed on the both sides of the inner-layer circuit sheet. Fifteen such laminates were placed in a vacuum press apparatus with one 1.6-mm stainless steel-made mirror surface sheet interposed between each two adjacent laminates, then were subjected to heating and pressing at a temperature elevation rate of 3 to 10° C./min at a pressure of 10 to 30 kg/cm² at a vacuum of −760 to −730 mmHg, and thereafter were maintained at 170° C. for 15 minutes or more, whereby multilayer printed circuit boards were produced.

EXAMPLE 2

In a mixed solvent of MEK and DMF were dissolved, with stirring, 60 parts of a hydroxyl-terminated amorphous polyethersulfone (weight-average molecular weight: 24,000), 20 parts of an epoxy resin having a bisphenol S skeleton and a biphenyl skeleton (weight-average molecular weight: 34,000, bisphenol S/biphenyl molar ratio: 5/4), 15 parts of a naphthalene type epoxy resin (weight-average molecular weight: 500, epoxy equivalent: 175), 15 parts of a novolac type epoxy resin (weight-average molecular weight: 320, epoxy equivalent: 175), 6.5 parts of diaminodiphenylsulfone and 0.5 part of 2-methylimidazole as a curing accelerator, whereby a varnish was prepared. Thereto were added 0.2 part of a titanate type coupling agent and 20 parts of fused silica of 0.5 μm in average particle diameter based on 100 parts of the resin solid in the varnish. The mixture was stirred until a uniform dispersion was obtained, whereby an adhesive varnish was produced. The later operations were conducted in the same manner as in Example 1, to obtain multilayer printed circuit boards.

EXAMPLE 3

In a mixed solvent of MEK and DMF were dissolved, with stirring, 20 parts of a hydroxyl-terminated amorphous polyethersulfone (weight-average molecular weight: 24,000), 30 parts of an epoxy resin having a bisphenol S skeleton and a bisphenol A skeleton (weight-average molecular weight: 34,000, bisphenol S/bisphenol A molar ratio: 3/8), 35 parts of a biphenyl type epoxy resin (weight-average molecular weight: 500, epoxy equivalent: 275), 30 parts of a novolac type epoxy resin (weight-average molecular weight: 320, epoxy equivalent: 175), 14.5 parts of diaminodiphenylsulfone and 0.5 part of 2-methyl imidazole as a curing accelerator, whereby a varnish was prepared. Thereto were added 0.2 part of a titanate type coupling agent and 30 parts of fused silica of 0.5 µm in average particle diameter based on 100 parts of the resin solid in the varnish. The mixture was stirred until a uniform dispersion was obtained, whereby an adhesive varnish was produced. The later operations were conducted in the same manner as in Example 1, to obtain multilayer printed circuit boards.

EXAMPLE 4

Operations were conducted in the same manner as in Example 3 except that the thermoplastic resin modified with hydroxyl group was converted to a non-modified amorphous polysulfone (weight-average molecular weight: 26,000), whereby multilayer printed circuit boards were produced.

EXAMPLE 5

In a mixed solvent of MEK and DMF were dissolved, with stirring, 50 parts of a hydroxyl-terminated amorphous polyethersulfone (weight-average molecular weight: 24,000), 30 parts of an epoxy resin having a bisphenol A skeleton and a bisphenol S skeleton (weight-average molecular weight: 34,000, bisphenol A/bisphenol S molar ratio: 8/3), 15 parts of a brominated phenolic novolac type epoxy resin (weight-average molecular weight: 1,100, epoxy equivalent: 285), 10 parts of a bisphenol F type epoxy resin (weight-average molecular weight: 350, epoxy equivalent: 175) and 5 parts of 2-methylimidazole as a curing agent. Thereto were added 0.2 part of a titanate type coupling agent and 20 parts of calcium carbonate, whereby an adhesive varnish was produced. The later operations were conducted in the same manner as in Example 1, to obtain multilayer printed circuit boards.

EXAMPLE 6

Operations were conducted in the same manner as in Example 5 except that the curing agent was changed to 15 parts of a bisphenol A type novolac resin (weight-average molecular weight: 350, hydroxyl equivalent: 120) and there was used 0.5 part of 2-methylimidazole as a curing accelerator, whereby multilayer printed circuit boards were obtained.

Comparative Example 1

Operations were conducted in the same manner as in Example 1 except that the epoxy resin having a bisphenol S skeleton and a biphenyl skeleton was not used and the amount of the hydroxyl-terminated amorphous polyethersulfone (weight-average molecular weight: 24,000) was increased to 80 parts, whereby multilayer printed circuit boards were obtained.

Comparative Example 2

Operations were conducted in the same manner as in Example 1 except that the hydroxyl-terminated amorphous polyethersulfone was not used and the amount of the epoxy resin having a bisphenol S skeleton and a biphenyl skeleton (weight-average molecular weight: 34,000) was increased to 80 parts, whereby multilayer printed circuit boards were obtained.

Comparative Example 3

Operations were conducted in the same manner as in Example 5 except that the epoxy resin having a bisphenol S skeleton and a bisphenol A skeleton was not used and the amount of the hydroxyl-terminated amorphous polyethersulfone (weight-average molecular weight: 24,000) was increased to 80 parts, whereby multilayer printed circuit boards were obtained.

Comparative Example 4

Operations were conducted in the same manner as in Example 5 except that the hydroxyl-terminated amorphous polyethersulfone was not used and the amount of the epoxy resin having a bisphenol S skeleton and a bisphenol A skeleton (weight-average molecular weight: 34,000) was increased to 80 parts, whereby multilayer printed circuit boards were obtained.

All of the multilayer printed circuit boards obtained above were measured for glass transition temperature, moldability, resistance to soldering heat after humidification, etc. The results are shown in Table 1.

TABLE 1

|  | Glass transition temperature (° C.) | Variation in insulating layer thickness (µm) | Moldability | Resistance to soldering heat after humidification | Flame retardancy |
| --- | --- | --- | --- | --- | --- |
| Example 1 | 185 | 7 | ○ | ○ | V-0 |
| Example 2 | 180 | 5 | ○ | ○ | V-0 |
| Example 3 | 185 | 10 | ○ | ○ | V-0 |
| Example 4 | 185 | 10 | ○ | ○ | V-0 |
| Example 5 | 185 | 6 | ○ | ○ | V-0 |
| Example 6 | 180 | 7 | ○ | ○ | V-0 |
| Comparative Example 1 | 188 | — | X | — | V-0 |
| Comparative Example 2 | 165 | 18 | ○ | ○ | V-1 |
| Comparative Example 3 | 188 | — | X | — | V-0 |
| Comparative Example 4 | 165 | 15 | ○ | ○ | V-0 |

Test Methods

1. Glass Transition Temperature (Tg)

Measured by a TMA (thermo mechanical analyzer) method.

2. Moldability

The presence or absence of voids between circuits and in clearance holes was examined visually. The mark ○ means absence of voids and × means presence of voids.

3. Variation in Insulating Layer Thickness

Variation in thickness of insulating layer on inner-layer circuit was observed by sectional observation. The sites of observation were (1) line (circuit) of fine circuit and (2) line (copper foil) between slits, of inner-layer circuit sheet. The thickness of insulating layer was measured at the above observation sites for 5 samples, the average of 5 measurements was calculated for each site, and the difference between the two averages was taken as variation in insulating layer thickness.

4. Resistance to Soldering Heat After Humidification

Humidification conditions:
pressure cooker treatment, 125° C., 2.3 atm., 1 hour

Test conditions:
when all of 5 samples showed no swelling for 180 seconds in a solder bath of 260° C., the result was reported as ○.

5. Flame Retardancy

Measured by a vertical method according to UL-94 specification. V-0 and V-1 are the levels of combustibility specified by UL-94 specification. The V-0 and V-1 shown in Table 1 indicate that these levels are met by individual samples. V-0 refers to lower combustibility, i.e. higher flame retardancy than V-1.

As clear from Table 1, the interlaminar insulating adhesive for multilayer printed circuit board according to the present invention has flame retardancy without containing any halogen or phosphorus, has excellent heat resistance without containing glass cloth, is low in variation in insulating layer thickness between circuit layers, and is suitable for formation of fine pattern; therefore, a multilayer printed circuit board can be easily produced using the above adhesive.

What is claimed is:

1. An interlaminar insulating adhesive for multilayer printed circuit board containing the following components as essential components:

(a) a sulfur-containing thermoplastic resin having a weight-average molecular weight of $10^3$ to $10^5$, (b) an epoxy or phenoxy resin having a weight-average molecular weight of $10^3$ to $10^5$, and having both a bisphenol S skeleton and a biphenyl skeleton, (c) a multifunctional epoxy resin having an epoxy equivalent of 500 or less, and (d) an epoxy-curing agent.

2. An interlaminar insulating adhesive for multilayer printed circuit board according to claim 1, wherein the component (a) is a polysulfone, a polyethersulfone or a mixture thereof.

3. An interlaminar insulating adhesive for multilayer printed circuit board according to claim 1, wherein the component (c) is a multifunctional epoxy resin having a weight-average molecular weight of 1,000 or less.

4. An interlaminar insulating adhesive for multilayer printed circuit board according to claim 1, wherein the component (a) is a polysulfone, a polyethersulfone or a mixture thereof, and the component (c) is a multifunctional epoxy resin having a weight-average molecular weight of 1,000 or less.

5. An interlaminar insulating adhesive for multilayer printed circuit board according to claim 3, wherein the component (c) is at least one kind of epoxy resin selected from naphthalene type epoxy resins, biphenyl type epoxy resins, bisphenol S type epoxy resins, indene-modified phenolic novolac type epoxy resins, indene-modified cresol novolac type epoxy resins, phenyl ether type epoxy resins and phenyl sulfide type epoxy resins.

6. An interlaminar insulating adhesive for multilayer printed circuit board according to claim 1, wherein the component (a) is a polysulfone, a polyethersulfone or a mixture thereof, and the component (c) is at least one kind of epoxy resin selected from naphthalene type epoxy resins, biphenyl type epoxy resins, bisphenol S type epoxy resins, indene-modified phenolic novolac type epoxy resins, indene-modified cresol novolac type epoxy resins, phenyl ether type epoxy resins and phenyl sulfide type epoxy resins.

7. An interlaminar insulating adhesive for multilayer printed circuit board according to claim 1, which further contains an inorganic filler.

8. An interlaminar insulating adhesive for multilayer printed circuit board according to claim 1, wherein the component (a) is a polysulfone, a polyethersulfone or a mixture thereof, the component (c) is at least one kind of epoxy resin selected from naphthalene type epoxy resins, biphenyl type epoxy resins, bisphenol S type epoxy resins, indene-modified phenolic novolac type epoxy resins, indene-modified cresol novolac type epoxy resins, phenyl ether type epoxy resins and phenyl sulfide type epoxy resins, and an inorganic filler is further contained.

9. A copper foil coated with an interlaminar insulating adhesive according to claim 1, for use in a multilayer printed circuit board.

10. A copper foil coated with an interlaminar insulating adhesive for multilayer-printed circuit board according to claim 9, wherein the interlaminar insulating adhesive consists of two adhesive layers of different flowability and the inner adhesive layer adjacent to the copper foil has lower flowability than the outer adhesive layer.

11. A multilayer printed circuit board comprising:

the interlaminar insulating adhesive according to claim 1;

copper foil coated with said interlaminar insulating adhesive; and an inner-layer circuit substrate laminated with said copper foil.

12. A method for making a multilayer printed circuit board comprising the following steps:

coating a copper foil with the interlaminar insulating adhesive according to claim 1, laminating said copper foil on an inner-layer circuit substrate; and curing said interlaminar insulating adhesive.

* * * * *